(12) United States Patent
Sakashita (10) Patent No.: US 8,012,594 B2
(45) Date of Patent: *Sep. 6, 2011

(54) FUNCTIONAL FILM CONTAINING STRUCTURE AND METHOD OF MANUFACTURING FUNCTIONAL FILM

(75) Inventor: Yukio Sakashita, Kaisei-machi (JP)

(73) Assignee: Fujifilm Corporation, Tokyo (JP)

( * ) Notice: Subject to any disclaimer, the term of this patent is extended or adjusted under 35 U.S.C. 154(b) by 616 days.

This patent is subject to a terminal disclaimer.

(21) Appl. No.: 11/916,573

(22) PCT Filed: Jun. 5, 2006

(86) PCT No.: PCT/JP2006/311667
§ 371 (c)(1),
(2), (4) Date: Dec. 5, 2007

(87) PCT Pub. No.: WO2006/132380
PCT Pub. Date: Dec. 14, 2006

(65) Prior Publication Data
US 2009/0104784 A1    Apr. 23, 2009

(30) Foreign Application Priority Data
Jun. 7, 2005   (JP) ................. 2005-166396

(51) Int. Cl.
B32B 17/06 (2006.01)
B32B 15/00 (2006.01)
B32B 37/00 (2006.01)
B32B 37/02 (2006.01)
H01L 21/30 (2006.01)

(52) U.S. Cl. .......... 428/457; 156/60; 156/155; 156/235; 257/E21.002; 438/758; 428/426; 428/701; 428/42.1

(58) Field of Classification Search .............. None
See application file for complete search history.

(56) References Cited

U.S. PATENT DOCUMENTS 3,053,651 A    9/1962 McGauley
(Continued)

FOREIGN PATENT DOCUMENTS

| EP | 0382661 | * | 8/1990 |
| JP | 54-94905 A | | 7/1979 |
| JP | 10-125929 A | | 5/1998 |
| JP | 2002-305334 A | | 10/2002 |
| WO | 95/16566 A1 | | 6/1995 |
| WO | 03/032384 A1 | | 4/2003 |

OTHER PUBLICATIONS

Annemarie De La Croix, "Modeling the Thermal Decomposition of Solids on the Basis of Lattice Energy Changes", Journal of Solid State Chemistry, 1998, pp. 332-345, vol. 137. Zongrong Liu, et al, "Calorimetric Evaluation of Phase Change Materials for Use as Thermal Interface Materials", Thermochimica Acta, 2001, pp. 135-147, vol. 366.

*Primary Examiner* — Timothy M Speer
*Assistant Examiner* — Vera Katz
(74) *Attorney, Agent, or Firm* — Sughrue Mion, PLLC (57) ABSTRACT

A method of manufacturing a functional film by which the functional film formed on a film formation substrate can be easily peeled from the film formation substrate. The method includes the steps of: (a) forming a separation layer by using an inorganic material on a substrate containing a material having heat tolerance to a predetermined temperature; (b) forming a layer to be peeled containing a functional film, which is formed by using a functional material, on the separation layer; and (c) performing heat treatment on a structure containing the substrate, the separation layer and the layer to be peeled at the predetermined temperature so as to peel the layer to be peeled from the substrate or reducing bonding strength between the layer to be peeled and the substrate.

20 Claims, 4 Drawing Sheets

U.S. PATENT DOCUMENTS

| | | |
|---|---|---|
| 4,259,401 A | 3/1981 | Chahroudi et al. |
| 6,071,795 A | 6/2000 | Cheung et al. |
| 6,589,857 B2 * | 7/2003 | Ogawa et al. ............. 438/502 |
| 2002/0047203 A1 | 4/2002 | Akahori et al. |
| 2002/0066524 A1 | 6/2002 | Kagawa et al. |
| 2004/0125197 A1 * | 7/2004 | Ogihara et al. ............. 347/238 |
| 2006/0125352 A1 * | 6/2006 | Sakashita et al. ............. 310/358 |
| 2008/0135162 A1 * | 6/2008 | Sakashita ............. 156/235 |
| 2009/0053478 A1 * | 2/2009 | Sakashita ............. 428/195.1 |
| 2009/0111279 A1 * | 4/2009 | Sakashita ............. 438/761 |

* cited by examiner

FUNCTIONAL FILM CONTAINING STRUCTURE AND METHOD OF MANUFACTURING FUNCTIONAL FILM

TECHNICAL FIELD

The present invention relates to a method of manufacturing a functional film including a dielectric material, piezoelectric material, pyroelectric material, magnetic material, semiconductor material or the like, and a functional film containing structure to be used in a manufacturing process of the functional film.

BACKGROUND ART

Recent years, in response to the needs for electronic devices such as miniaturization, speeding up, integration, and multifunctionality, the manufacture of devices containing functional materials such as electronic ceramics, which express predetermined functions by being applied with electric fields or magnetic fields and include a dielectric material, piezoelectric material, magnetic material, pyroelectric material and semiconductor material, by using various film formation technologies has been actively studied.

For example, in order to enable high-definition and high-quality printing in an inkjet printer, it is necessary to miniaturize and highly integrate ink nozzles of inkjet heads. Accordingly, it is also necessary to similarly miniaturize and highly integrate piezoelectric actuators for driving the respective ink nozzles. In such a case, a film formation technology, that enables formation of a thinner layer than a bulk material and formation of fine patterns, is desired, and film formation technologies such as a sputteringmethod, a sol-gel method, and an aerosol deposition method have been studied.

However, there has been a problem that a film of function material (also simply referred to as "functional film") formed by film formation does not sufficiently exert its function in a condition after the film formation, and the film is inferior to a bulk material in performance.

In order to sufficiently express the function of a functional film, heat treatment at relatively high temperature (e.g., about 500° C. to 1000° C.) is required after film formation. Since a substrate that is used at the time of film formation (film formation substrate) is simultaneously heat-treated, high heat tolerance is required for the material of film formation substrate. On the other hand, in the case where a fabricated function film is utilized, there is demand for using various kinds of substrates according to instruments such as a flexibly substrate made of resin, for example. Accordingly, a method has been studied by which a functional film formed on a film formation substrate can be peeled from the film formation substrate without hindering its function.

As a related technology, Japanese Patent Application Publication JP-A-54-94905 discloses a multilayered structure for thin film transfer having a heat-resistant substrate, a release layer principally containing carbon and/or carbon compound, and a functional thin film as main component elements (pages 1 and 3). Further, JP-A-54-94905 discloses that the functional thin film can be peeled from the heat-resistant substrate and transferred to another substrate because the release layer can be removed by oxidization (combustion).

Japanese Patent Application Publication JP-A-10-125929 discloses a peeling method by which any material to be peeled can be easily peeled regardless of its properties or conditions, and especially, the peeled material can be transferred to various transfer materials. The peeling method is to peel a material to be peeled existing on a substrate via a separation layer having a multilayered structure of plural layers from the substrate, and includes the step of applying irradiating light to the separation layer to cause peeling within the layer of the separation layer and/or at an interface thereof so as to detach the material to be peeled from the substrate (pages 1-2).

Japanese Patent Application Publication JP-P2002-305334A discloses a method of transferring a functional thin film in order to obtain a less defective functional thin film by easy and perfect peeling at the interface between a functional thin film structure and a separation layer. That is, the method is to transfer a functional thin film formed on a first substrate onto a second substrate, and includes the steps of forming a separation layer containing a metal nitride layer on the first substrate, subsequently forming a functional thin film structure containing oxygen directly on the separation layer, providing the second substrate on the functional thin film structure, forming an oxide layer by oxidizing the separation layer at the functional thin film structure side by heating, and peeling at the interface between the oxide layer and the functional thin film structure so as to transfer the functional film structure formed on the first substrate onto the second substrate (page 1).

However, according to JP-A-54-94905, since the release layer is removed by oxidation reaction, the atmosphere in the heat treatment process is limited to an oxygen atmosphere. Further, since carbon or carbon compound is used as the release layer, there is the upper limit to heating temperature. For example, in an embodiment disclosed in JP-A-54-94905, the treatment temperature in the transfer process is 630° C. at the highest. Therefore, the present invention disclosed in JP-A-54-94905 cannot be applied to a manufacture of electronic ceramics that requires heat treatment at relatively high temperature (e.g., 900° C. or more).

Further, according to JP-A-10-125929, peeling is caused within the separation layer by applying a laser beam to a light absorption layer contained in the separation layer to allow the light absorption layer to ablate. Since the irradiating light is applied to the separation layer via the substrate, the substrate requires translucency. Accordingly, the method is not preferable because the substrate material is limited.

Furthermore, according to JP-P2002-305334A, since the complex multilayer structure containing the nitride layer and oxide layer is formed, the process is complicated and the cost of manufacturing may rise. Further, according to JP-P2002-305334A, the metal nitride layer contained in the separation layer changes into oxide by heat treatment, and thereby, stress is caused at the interface between them and the adhesion is reduced. Since they are mechanically torn off by the reduction in adhesion, it is conceivable that there is a problem in peeling property.

DISCLOSURE OF THE INVENTION

In view of the above-mentioned problems, a first purpose of the present invention is to provide a method of manufacturing a functional film by which the functional film formed on a film formation substrate can be easily peeled from the film formation substrate. Further, a second purpose of the present invention is to provide a functional film containing structure to be used in a manufacturing process of such a functional film.

In order to accomplish the purposes, a functional film containing structure according to one aspect of the present invention includes: a substrate; a separation layer provided on the substrate and formed by using an inorganic material; and a layer to be peeled provided on the separation layer and containing a functional film formed by using a functional material, wherein the layer to be peeled is peeled from the substrate or bonding strength between the layer to be peeled and the substrate becomes lower by heating the separation layer.

Further, a method of manufacturing a functional film according to one aspect of the present invention includes the steps of: (a) forming a separation layer by using an inorganic material on a substrate containing a material having heat tolerance to a predetermined temperature; (b) forming a layer to be peeled containing a functional film, which is formed by using a functional material, on the separation layer; and (c) performing heat treatment on a structure containing the substrate, the separation layer and the layer to be peeled at the predetermined temperature so as to peel the layer to be peeled from the substrate or reduce bonding strength between the layer to be peeled and the substrate.

Here, "reaction" refers to a process in which, from one material or material system, another material or material system different from the initial material or material system in composition or structure is produced. And "reaction" includes a process in which one kind of compound changes into two or more kinds of simpler materials, and a process in which, based on two kinds of materials including at least one kind of compound, two or more kinds of materials different from the initial materials are produced. Further, the former case is specifically referred to as "decomposition", and the decomposition brought about by heating is referred to as "thermal decomposition".

According to the present invention, the separation layer containing the inorganic material removable by heating is provided between the film formation substrate and the functional film, and therefore, the film formation substrate and the functional film can be easily peeled. Alternatively, the bonding strength between the film formation substrate and the functional film can be reduced so that they can be dynamically and easily peeled at the subsequent step. Accordingly, properties of the functional film can be improved by heat treatment, and further, the functional film having improved properties can be provided on a flexible substrate or the like having relatively low heat tolerance and utilized. Therefore, elements having advantageous properties can be suitably mounted on instruments according to application and the performance of the entire instruments utilizing such elements can be improved.

BRIEF DESCRIPTION OF THE DRAWINGS

Advantages and features of the present invention will be apparent by considering the following detailed description and the drawings in relation. In these drawings, the same reference numerals indicate the same component elements.

BEST MODE FOR CARRYING OUT THE INVENTION

Figure 1:
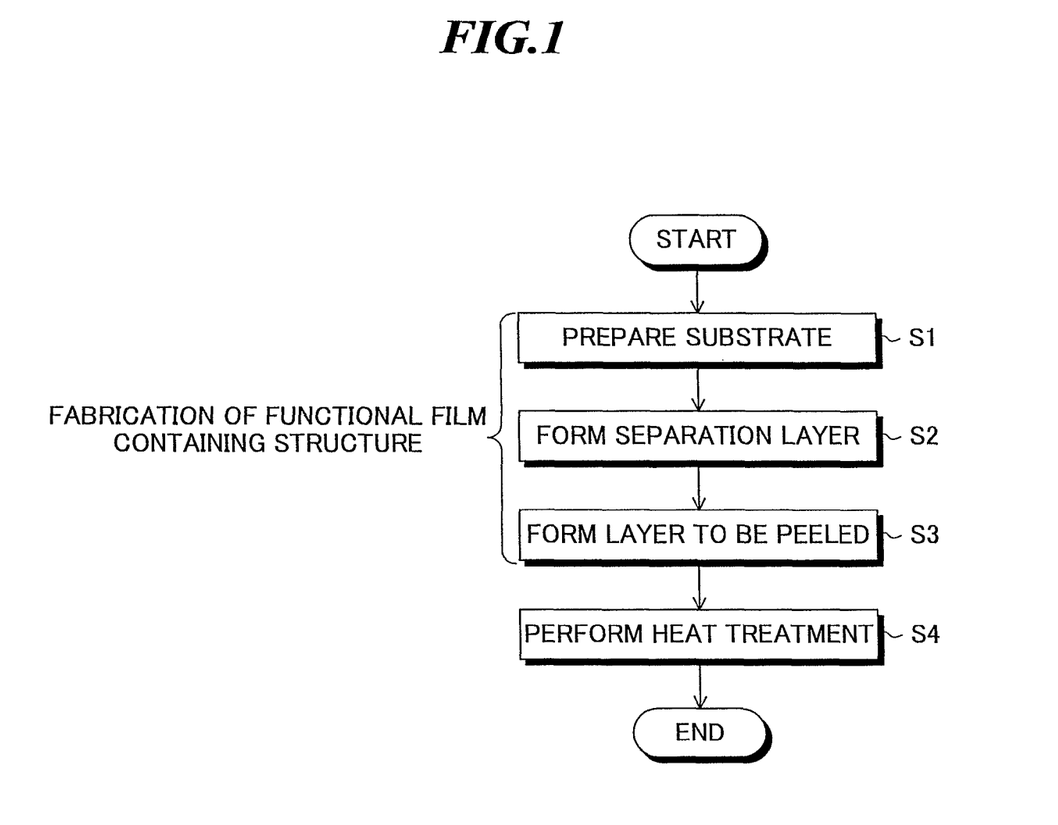
FIG. 1 is a flowchart showing a method of manufacturing a functional film according to one embodiment of the present invention.

FIG. 1 is a flowchart showing a method of manufacturing a functional film according to one embodiment of the present invention. Further, FIGS. 2A to 4 are diagrams for explanation of the method of manufacturing a functional film according to the one embodiment of the present invention, in which FIGS. 2A to 2C show steps of fabricating a functional film containing structure according to the first embodiment of the present invention.

Figure 2A:
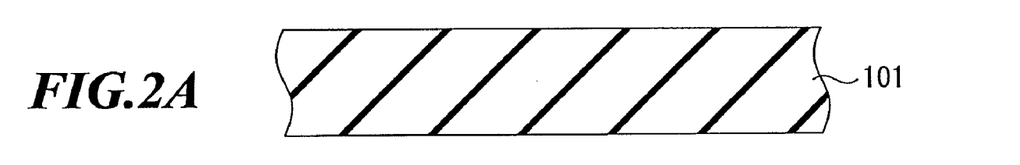
FIGS. 2A to 2C are sectional views for explanation of the method of manufacturing a functional film according to the one embodiment of the present invention.
Figure 2B:
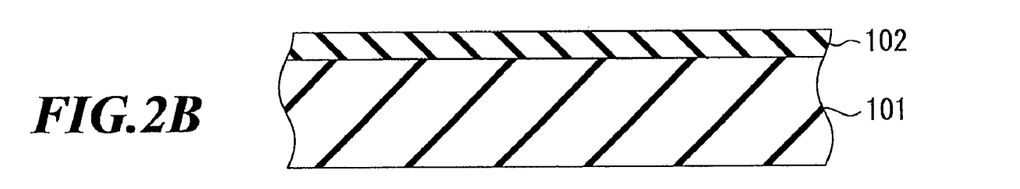
Figure 2C:
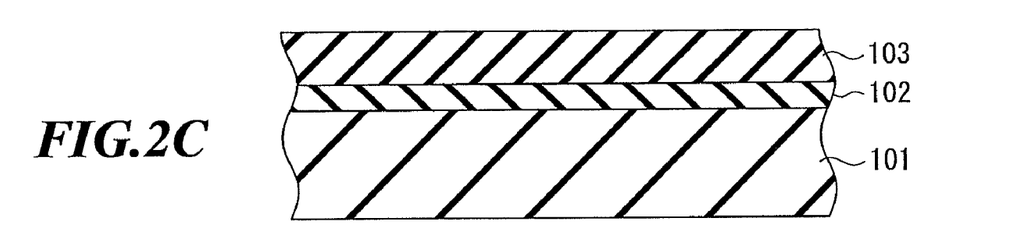

First, at step S1 in FIG. 1, a substrate 101 as shown in FIG. 2A is prepared. As the substrate 101, for example, an oxide single crystal substrate, a semiconductor single crystal substrate, a ceramic substrate, a glass substrate or a metal substrate is used.

As an oxide single crystal substrate material, specifically, magnesium oxide (MgO), alumina ($Al_2O_3$), titanium oxide ($TiO_2$), zinc oxide (ZnO), spinel (magnesium aluminate, $MgAl_2O_4$), strontium titanate ($SrTiO_3$), lanthanum aluminate ($LaAlO_3$), lithium niobate ($LiNbO_3$), lithium tantalate ($LiTaO_3$) and so on are cited. Since these materials are stable in an oxidizing atmosphere, they can be heat-treated at high temperature (e.g., about 1000° C. for magnesium oxide) in the air atmosphere. Further, by selecting a substrate material having a lattice constant predetermined according to a functional film as a target of manufacturing, the functional film can be formed by epitaxial growth.

As a material of the semiconductor single crystal substrate, specifically, silicon (Si), germanium (Ge), gallium arsenide (GaAs), gallium phosphide (GaP), indium phosphide (InP) and so on are cited. Since these materials are stable in a reducing atmosphere, they can be heat-treated at high temperature (e.g., about 1000° C. for silicon) in the reducing atmosphere. Further, by selecting a substrate material having a lattice constant predetermined according to a functional film as a target of manufacturing, the functional film can be formed by epitaxial growth.

As a material of the ceramic substrate, alumina ($Al_2O_3$), zirconia ($ZrO_2$), aluminum nitride (AlN) and so on are cited. Since these materials are stable in the air atmosphere and have high heat tolerance, they can be heat-treated at high temperature (e.g., about 1100° C. for alumina) in the air atmosphere. Further, since they are inexpensive, the cost of manufacturing can be reduced.

As a material of the glass substrate, specifically, silicate glass, alkaline silicate glass, borosilicate glass, soda-lime glass, lead glass and so on are cited. Since these materials are stable in an oxidizing atmosphere, they can be heat-treated at high temperature (e.g., about 900° C. for silicate glass) in the air atmosphere. Further, since they are more inexpensive than the single crystal substrate, the cost of manufacturing can be reduced.

As a material of the metal substrate, specifically, metal such as platinum (Pt), copper (Cu), nickel (Ni), iron (Fe) and so on and alloy such as stainless steel are cited. Since these materials are stable in a reducing atmosphere, they can be heat-treated at high temperature (e.g., about 1000° C. for platinum) in the reducing atmosphere. Further, since they are more inexpensive than the single crystal substrate, the cost of manufacturing can be reduced.

The substrate material is selected according to film formation temperature of a functional film as a target of manufacturing, heat treatment (post anneal) temperature, and heat treatment atmosphere as described below.

Next, at step S2, as shown in FIG. 2B, a separation layer 102 is formed on the substrate 101. The separation layer 102 is a sacrifice layer that is removed when a functional film to be formed in the subsequent step is peeled from the substrate 101. As a material of the separation layer 102, a material is used that induces a reaction of thermal decomposition or the like by being heated to generate a gas. Specifically, a compound containing at least one of carbonates of magnesium carbonate ($MgCO_3$), calcium carbonate ($CaCO_3$), strontium carbonate ($SrCO_3$), barium carbonate ($BaCO_3$), lithium carbonate ($LiCO_3$), sodium carbonate ($Na_2CO_3$), potassium carbonate ($K_2CO_3$) and so on, a compound containing at least one of sulfates of magnesium sulfate ($MgSO_4$), calcium sulfate ($CaSO_4$), strontium sulfate ($SrSO_4$), barium sulfate ($BaSO_4$), iron sulfate ($FeSO_4$), cobalt sulfate ($CoSO_4$), nickel sulfate ($NiSO_4$), zinc sulfate ($ZnSO_4$), lead sulfate ($PbSO_4$), bismuth sulfate ($Bi(SO_4)_3$) and so on, and a compound containing at least one of nitrates of strontium nitrate ($Sr(NO_3)_2$), cesium nitrate ($CsNO_3$) and so on are used. These compounds are decomposed by being heated to generate gases. For example, by heating calcium carbonate, decomposition reaction ($CaCO_3 \rightarrow CaO+CO_2\uparrow$) occurs and carbon dioxide ($CO_2$) is generated.

Alternatively, metal nitride containing at least one element of Ti, V, Cr, Mn, Fe, Co, Ni, Ga, Zr, Mo, Ta and W, metal sulfide containing at least one element of V, Cr, Mn, Fe, Co, Ni, Mo, Ta and W, and metal carbide such as TiC may be used. These compounds react, when heated in a predetermined gaseous atmosphere, with components in the gaseous atmosphere to generate a gas, and/or react, when heated, with an adjacent layer, i.e., materials contained in the substrate 101 and/or a layer to be peeled 103 or 104, which will be described later, to generate a gas. For example, in the case where a substrate containing oxide and a separation layer containing metal nitride are used, the separation layer reacts with the oxide substrate to generate nitrogen ($N_2$).

Further, as a method of forming the separation layer, a known method such as spin coating, sputtering and CVD (chemical vapor deposition) methods may be used.

Here, regarding the substrate 101 prepared at step S1 and the separation layer 102 formed at step S2, it is desired to select a suitable material according to a film formation temperature of a functional film as a target of manufacturing, heat treatment temperature, heat treatment atmosphere, existing heat treatment equipment and so on. For example, in the case of manufacturing a PZT (lead zirconium titanate) film, since the heat treatment temperature is about 500° C., it is desired to select a substrate material having heat tolerance to 500° C. or more and a separation layer material that exhibits reaction of thermal decomposition or the like at temperature of nearly 500° C. or less. Furthermore, in addition to the viewpoint, it is desired to select the separation layer material in consideration of interaction (diffusion or the like) with a layer to be peeled, which will be described later.

Next, at step S3, a layer to be peeled 103 containing a material of a functional film as a target of manufacturing (functional material) is formed on the separation layer 102 as shown in FIG. 2C. The layer to be peeled 103 is formed by using a known method such as a sputtering method, a CVD method, a sol-gel method and an aerosol deposition (AD) method. Here, the AD method is a film forming method including the steps of generating an aerosol in which a raw material powder is dispersed in a gas, injecting the aerosol from a nozzle toward a substrate to allow the raw material powder to collide with the under layer, and thereby, depositing the raw material on the substrate, and the AD method is also called "injection deposition method" or "gas deposition method".

In the embodiment, specifically, the following materials are used as functional materials.

As a material of a functional film to be used for a memory element, $Pb(Zr,Ti)O_3$, $SrBi_2(Ta,Nb)_2O_9$, $Bi_4Ti_3O_{12}$ and so on are cited.

As a material of a functional film to be used for a piezoelectric element such as an actuator, $Pb(Zr,Ti)O_3$, $Pb(Mg_{1/3} Nb_{2/3})O_3$, $Pb(Zn_{1/3} Nb_{2/3})O_3$, $Pb(Ni_{1/3} Nb_{2/3})O_3$ and so on, and solid solutions thereof are cited.

As a material of a functional film to be used for a pyroelectric element such as an infrared sensor, $Pb(Zr,Ti)O_3$, $(Pb,La)(Zr,Ti)O_3$ and so on are cited.

As a material of a functional film to be used for a passive component such as a capacitor, $BaSrTiO_3$, $(Pb,La)(Zr,Ti)O_3$ and so on are cited.

As a material of a functional film to be used for an optical element such as an optical switch, $(Pb,La)(Zr,Ti)O_3$, $LiNbO_3$ and so on are cited.

As a material of a functional film to be used for a superconducting element such as a superconducting quantum interference device (SQUID), $YBa_2Cu_3O_7$, $Bi_2Sr_2Ca_2Cu_3O_{10}$ and so on are cited. Here, SQUID refers to a highly sensitive magnetic sensor element utilizing superconductivity.

As a material of a functional film to be used for a photoelectric conversion element such as a solar cell, amorphous silicon and compound semiconductor are cited.

As a material of a functional film to be used for a micro magnetic element such as a magnetic head, PdPtMn, CoPtCr and so on are cited.

As a material of a functional film to be used for a semiconductor element such as a TFT, amorphous silicon and so on are cited.

Figure 3:
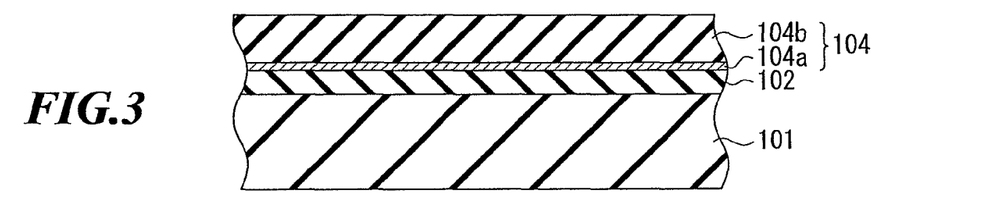
FIG. 3 is a sectional view showing another configuration of a functional film containing structure.

Alternatively, at step S3, a functional material layer may be formed via an electrode layer 104a as shown in FIG. 3, not directly formed on the separation layer 102 as shown in FIG. 2C. In this case, the electrode layer 104a and a functional material layer 104b are included in a layer to be peeled 104. The electrode layer 104a may be formed on the separation layer in advance by using a known method such as a sputtering method, an evaporation method and an AD method.

The functional film containing structure according to the embodiment includes the substrate 101, the separation layer 102, and the layer to be peeled 103 or 104 formed at those steps S1 to S3.

Next, at step S4 in FIG. 1, heat treatment is performed on the functional film containing structure as shown in FIG. 2C or FIG. 3. The heat treatment is performed for promoting grain growth in the functional film or improving crystallinity so as to improve the function of the film and peel the layer to be peeled 103 or 104 from the separation layer 102 or reduce the bonding strength between the layer to be peeled 103 or 104 and the separation layer 102 for easy peeling. For example, in the case of manufacturing a functional film of $Pb(Zr,Ti)O_3$, $(Pb,La)(Zr,Ti)O_3$, $BaSrTi_3$ or the like, heat treatment is performed at temperature of 500° C. or more. Further, in the case of manufacturing a functional film of $SrBi_2(Ta,Nb)_2O_9$, $Bi_4Ti_3O_{12}$, $YBa_2Cu_3O_7$, $Bi_2Sr_2Ca_2Cu_3O_{10}$ or the like, heat treatment is performed at temperature of 700° C. or more.

Figure 4:
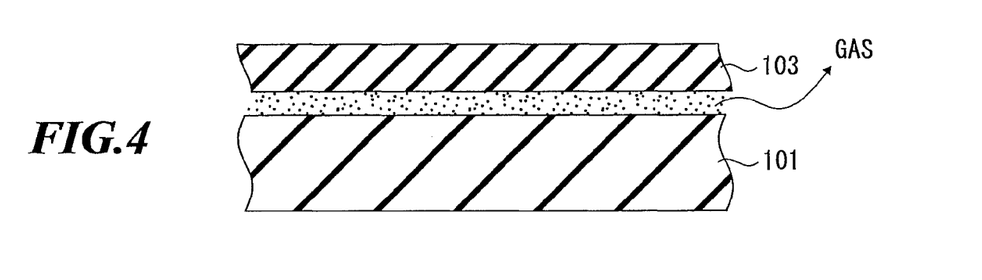
FIG. 4 is a sectional view for explanation of the method of manufacturing a functional film according to the one embodiment of the present invention.

As described above, the separation layer 102 is formed of a material having a reaction temperature at the same level as a heat treatment temperature of the functional film or less than that (step S2). Accordingly, by performing heat treatment on the functional film, reaction such as thermal decomposition occurs in the separation layer 102 and a gas is generated. As a result, as shown in FIG. 4, the separation layer 102 disappears so that the layer to be peeled 103 is peeled from the substrate 101. Alternatively, as a result of generation of the gas, the bonding strength between the layer to be peeled 103 and the substrate 101 becomes lower, and thereby, the layer to be peeled 103 can be dynamically and easily peeled from the substrate 101 at the same time as the heat treatment or at the subsequent step.

Figure 5:
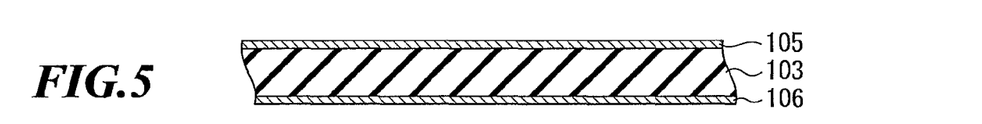
FIG. 5 is a sectional view showing a functional element containing the functional film manufactured by the method of manufacturing a functional film according to the one embodiment of the present invention.

Furthermore, as shown in FIG. 5, by forming electrodes 105 and 106 on both sides of the layer to be peeled 103 that has been peeled, that is, the functional film, a functional film element is completed. The electrodes 105 and 106 may be formed by using a known method such as a sputtering method and an evaporation method. The electrode 105 formed on the upper surface of the layer to be peeled 103 may be formed before the layer to be peeled 103 is peeled from the substrate 101 at step S4. Further, in the case of using the functional film containing structure as shown in FIG. 3, it is only necessary to form an electrode on the opposite side of the electrode layer 104a.

EXAMPLE 1

A calcium carbonate thin film having a thickness of about 0.2 µm is formed as a separation layer by applying a calcium hydrogen carbonate solution onto a zirconia ($ZrO_2$) substrate by spin coating and drying it in an atmosphere at 200° C. A platinum (Pt) electrode is formed by evaporation on the calcium carbonate thin film, and a PZT film having a thickness of about 50 µm is formed according to the AD method thereon. At this time, the substrate is heated to a temperature of 400° C. The piezoelectric constant d31 of thus obtained PZT film is measured as 50 pm/V.

The zirconia substrate formed with the PZT film is heat-treated in an atmosphere at 950° C. Thereby, the calcium carbonate thin film is decomposed to generate a gas. As a result, the PZT film and the platinum film are peeled from the zirconia substrate. The piezoelectric constant d31 of the PZT film is 250 pm/V. Thus, it is confirmed that the piezoelectric performance of the PZT film has been improved by the heat treatment. Further, no damage such as cracking or flaking has been observed in the PZT electrode and platinum electrode.

EXAMPLE 2

A titanium nitride film having a thickness of about 0.3 µm is formed as a separation layer on a silicon (Si) substrate formed with a silicon thermally oxidized film ($SiO_2$) on a surface thereof according to a reactive sputtering method. Then, a lower electrode of platinum (Pt) is formed on the titanium nitride film according to a sputtering method, and a $BaTiO_3$ film having a thickness of about 10 µm is formed thereon according to an AD method. At this time, the substrate temperature is set to about 400° C. Furthermore, an upper electrode of platinum (Pt) is formed on the $BaTiO_3$ film according to the sputtering method. The permittivity $\in$ of thus obtained $BaTiO_3$ film is measured as $\in$=400.

Then, the silicon substrate formed with the $BaTiO_3$ film thereon is heat-treated in an atmosphere at about 800° C. Thereby, the titanium nitride film reacts to generate a gas, and consequently, the $BaTiO_3$ film with the platinum electrodes on both sides thereof are peeled from the silicon substrate. The permittivity $\in$ of the $BaTiO_3$ film after the heat treatment is measured as $\in$=2000. Thus, it is confirmed that the dielectric property of the $BaTiO_3$ film has been improved by the heat treatment. In observation of the $BaTiO_3$ film and the platinum electrodes on both sides thereof, no breakage such as cracking or flaking is recognized.

As explained above, according to the one embodiment of the present invention, the separation layer is provided between the film formation substrate and the functional film, and therefore, the functional film can be easily peeled from the film formation substrate or the bonding strength between them can be reduced by heat treatment. Consequently, an element containing a functional film formed according to the AD method and further provided with a high function by heat treatment can be provided on a desired substrate. That is, a flexible substrate formed by resin or the like can be used as the substrate, and thereby, the range of choices of substrate materials can be expanded according to application. Further, since the heat treatment step and peeling step can be performed simultaneously by selecting a suitable material of the separation layer according to the heat treatment temperature and heat treatment atmosphere for the functional film, the manufacturing process becomes simple and the cost of manufacturing can be reduced.

Figure 6A:
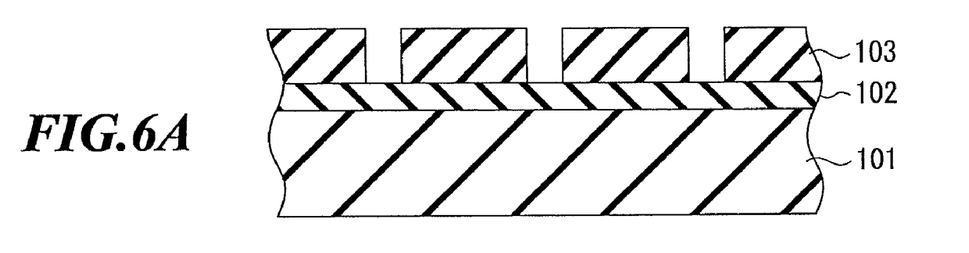
FIG. 6A is a sectional view showing a functional film containing structure in which a pattern has been formed.
Figure 6B:
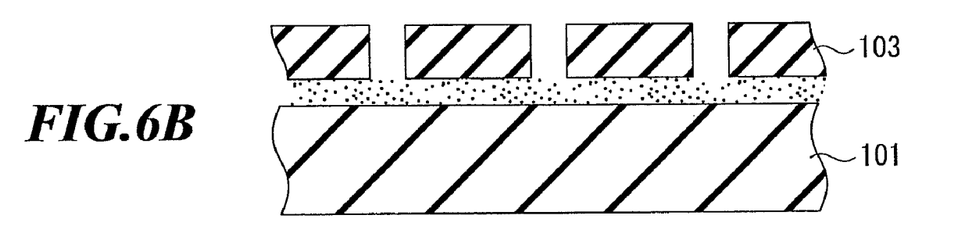
FIG. 6B is a sectional view for explanation of the method of manufacturing a functional film using the functional film containing structure.

Although the functional film is formed on the entire surface of the substrate in the embodiment, a desired pattern may be formed at least on the layer to be peeled 103 as shown in FIG. 6A. In that case, at step S3, film formation according to the AD method or the like may be performed by using a metal mask formed with an opening having a desired pattern. Alternatively, a resist layer formed with an opening having a desired pattern may be formed on the separation layer 102, and the resist may be removed after the layer to be peeled 103 is formed. Alternatively, after the layer to be peeled 103 is formed on the entire surface of the separation layer 102, a pattern may be formed at least in the layer to be peeled 103 by etching. As shown in FIG. 6B, by heating the functional film containing structure in which a pattern has been thus formed, a functional film having a desired shape can be obtained in advance.

Further, as a modified example of the embodiment, at step S4 in FIG. 1, electromagnetic radiation such as ultraviolet, infrared and microwave may be applied to the separation layer 102 (FIG. 2C) in parallel with heat treatment on the functional film containing structure. For example, since the separation layer 102 is activated by being applied with a laser beam having a wavelength according to an absorption band of a material forming the separation layer 102, peeling of the functional film 103 and the substrate 103 can be promoted.

INDUSTRIAL APPLICABILITY

The present invention can be applied to memory elements, piezoelectric elements, pyroelectric elements, passive elements such as capacitors, optical elements, superconducting elements, photoelectric conversion elements, micro magnetic elements and semiconductor elements containing functional materials such as dielectric materials, piezoelectric materials, pyroelectric materials, magnetic material and semiconductor materials, and instruments to which those elements are applied.

The invention claimed is:

1. A functional film containing structure comprising:
a substrate;
a separation layer provided on said substrate; and
a layer to be peeled provided on said separation layer and containing one of a functional film consisting of at least one metal and a functional film consisting of an oxide of at least one metal material;
wherein said separation layer contains at least one of carbonate, sulfate, nitrate, metal nitride, metal carbide, and metal sulfide such that said layer to be peeled is capable of being peeled from said substrate or bonding strength between said layer to be peeled and said substrate becomes lower by heating said separation layer.

2. The functional film containing structure according to claim 1, wherein said separation layer contains a material which is capable of being decomposed to generate a gas by being heated.

3. The functional film containing structure according to claim 1, wherein said separation layer contains at least one of magnesium carbonate ($MgCO_3$), calcium carbonate ($CaCO_3$), strontium carbonate ($SrCO_3$), barium carbonate ($BaCO_3$), lithium carbonate ($LiCO_3$), sodium carbonate ($Na2CO_3$), potassium carbonate ($K2CO_3$), magnesium sulfate ($MgSO_4$), calcium sulfate ($CaSO_4$), strontium sulfate ($SrSO_4$), barium sulfate ($BaSO_4$), iron sulfate ($FeSO_4$), cobalt sulfate ($CoSO_4$), nickel sulfate ($NiSO_4$), zinc sulfate ($ZnSO_4$), lead sulfate ($PbSO_4$), bismuth sulfate ($Bi(SO_4)_3$), strontium nitrate ($Sr(NO_3)_2$) and cesium nitrate ($CsNO_3$).

4. The functional film containing structure according to claim 1, wherein said separation layer contains a material which is capable of reacting with a gas in an atmosphere and/or with a material contained in said substrate and/or said layer to be peeled to generate a gas by being heated.

5. The functional film containing structure according to claim 1, wherein said substrate includes one of an oxide single crystal substrate, a semiconductor single crystal substrate, a ceramic substrate, a glass substrate and a metal substrate.

6. The functional film containing structure according to claim 1, wherein said functional film contains at least one of a piezoelectric material, a pyroelectric material, a ferroelectric material, a superconducting material, a magnetic material, and a semiconductor material.

7. The functional film containing structure according to claim 1, wherein said layer to be peeled includes an electrode layer provided on said separation layer and the functional film provided on said electrode layer.

8. The functional film containing structure according to claim 1, wherein at least said layer to be peeled has a predetermined pattern.

9. A method of manufacturing a functional film, said method comprising the steps of:
(a) forming a separation layer on a substrate containing a material having heat tolerance to a predetermined temperature, said separation layer containing at least one of carbonate, sulfate, nitrate, metal nitride, metal carbide, and metal sulfide;
(b) providing a layer to be peeled containing one of a functional film consisting of at least one metal material and a functional film consisting of an oxide of at least one metal material, on said separation layer; and
(c) performing heat treatment on a structure containing said substrate, said separation layer and said layer to be peeled at the predetermined temperature so as to peel said layer to be peeled from said substrate or reduce bonding strength between said layer to be peeled and said substrate.

10. The method of manufacturing a functional film according to claim 9, wherein said separation layer contains a material which is decomposed to generate a gas by being heated.

11. The method of manufacturing a functional film according to claim 10, wherein said separation layer contains at least one of carbonate, sulfate and nitrate.

12. The method of manufacturing a functional film according to claim 11, wherein said separation layer contains at least one of magnesium carbonate ($MgCO_3$), calcium carbonate ($CaCO_3$), strontium carbonate ($SrCO_3$), barium carbonate ($BaCO_3$), lithium carbonate ($LiCO_3$), sodium carbonate ($Na_2CO_3$), potassium carbonate ($K_2CO_3$), magnesium sulfate ($MgSO_4$), calcium sulfate ($CaSO_4$), strontium sulfate ($SrSO_4$), barium sulfate ($BaSO_4$), iron sulfate ($FeSO_4$), cobalt sulfate ($CoSO_4$), nickel sulfate ($NiSO_4$), zinc sulfate ($ZnSO_4$), lead sulfate ($PbSO_4$), bismuth sulfate ($Bi(SO_4)_3$), strontium nitrate ($Sr(NO_3)_2$) and cesium nitrate ($CsNO_3$).

13. The method of manufacturing a functional film according to claim 9, wherein said separation layer contains a material which reacts with a gas in an atmosphere and/or with a material contained in said substrate and/or said layer to be peeled to generate a gas by being heated.

14. The method of manufacturing a functional film according to claim 13, wherein said separation layer contains at least one of metal nitride, metal carbide and metal sulfide.

15. The method of manufacturing a functional film according to claim 9, wherein said substrate includes one of an oxide single crystal substrate, a semiconductor single crystal substrate, a ceramic substrate, a glass substrate and a metal substrate.

16. The method of manufacturing a functional film according to claim 9, wherein said functional film contains at least one of a piezoelectric material, a pyroelectric material, a ferroelectric material, a superconducting material, a magnetic material, and a semiconductor material.

17. The method of manufacturing a functional film according to claim 9, wherein step (b) includes forming an electrode layer on said separation layer and forming the functional film on said electrode layer.

18. The method of manufacturing a functional film according to claim 9, wherein step (b) includes forming an electrode layer on the functional film formed directly or indirectly on said separation layer.

19. The method of manufacturing a functional film according to claim 9, wherein step (c) includes performing heat treatment on the structure containing said substrate, said separation layer and said layer to be peeled at not less than 500° C.

20. The method of manufacturing a functional film according to claim 9, further comprising the step of:
forming a pattern at least in said layer to be peeled by etching after step (b).

* * * * *